United States Patent [19]

Papageorge et al.

[11] Patent Number: 5,438,224
[45] Date of Patent: Aug. 1, 1995

[54] INTEGRATED CIRCUIT PACKAGE HAVING A FACE-TO-FACE IC CHIP ARRANGEMENT

[75] Inventors: Marc V. Papageorge; Bruce J. Freyman, both of Boca Raton; Frank J. Juskey, Coral Spring, all of Fla.; John R. Thome, Palatine, Ill.

[73] Assignee: Motorola, Inc., Schaumburg, Ill.

[21] Appl. No.: 159,910

[22] Filed: Dec. 1, 1993

Related U.S. Application Data

[63] Continuation of Ser. No. 872,371, Apr. 23, 1992, now abandoned.

[51] Int. Cl.⁶ .............. H01L 23/02; H01L 23/12; H01L 23/44; H01L 29/44
[52] U.S. Cl. .................. 257/777; 257/686; 257/678; 257/774; 257/787
[58] Field of Search ............ 257/723, 777, 778, 786, 257/776, 774, 701, 702, 686, 704, 710, 787, 678, 685

[56] References Cited

U.S. PATENT DOCUMENTS

| | | | |
|---|---|---|---|
| 3,388,301 | 6/1968 | James | 257/778 |
| 3,577,037 | 5/1971 | DiPietro et al. | 257/777 |
| 4,700,276 | 10/1987 | Freyman et al. | 361/403 |
| 4,700,473 | 10/1987 | Freyman et al. | 29/846 |
| 4,792,532 | 12/1988 | Othani et al. | 437/206 |
| 4,819,041 | 4/1989 | Redmond | 357/80 |
| 4,862,322 | 8/1989 | Bickford et al. | 257/723 |
| 5,198,963 | 3/1993 | Jupta et al. | 257/777 |
| 5,331,235 | 7/1994 | Chun | 257/777 |

FOREIGN PATENT DOCUMENTS 61-101067 10/1984 Japan .............. H01L 25/04

Primary Examiner—Jerome Jackson
Assistant Examiner—Carl Whitehead, Jr
Attorney, Agent, or Firm—Dale W. Dorinski

[57] ABSTRACT

An integrated circuit package includes a stacked integrated circuit chip arrangement (140) placed on a circuit substrate. The stacked IC chip arrangement includes a first IC chip (110) and a second IC chip (120), each having an array of terminals (116, 126) and being positioned in a face-to-face manner. An interposed substrate (130) is positioned between the first IC chip (110) and the second IC chip (120) such that circuitry disposed on the interposed substrate (130) provides electrical connection among the arrays of terminals of the first IC chip (110) and the second IC chip (120) and external circuitry.

3 Claims, 2 Drawing Sheets

INTEGRATED CIRCUIT PACKAGE HAVING A FACE-TO-FACE IC CHIP ARRANGEMENT

This is a continuation of application Ser. No. 07/872,371, filed Apr. 23, 1992, and now abandoned.

TECHNICAL FIELD

This invention relates in general to the field of integrated circuits and in particular to a packaging arrangement for an integrated circuit assembly.

BACKGROUND

The demand for miniaturizing electrical assemblies requires devising techniques to efficiently utilize the available area on a main circuit board. A so-called flip-chip technology has been utilized, wherein a bumped integrated circuit (bumped IC) carries a pad arrangement on its front surface. The IC is turned upside down, i.e. flipped, allowing direct coupling between the pads and corresponding contacts on a main circuit board or a chip carrier. The direct connection is facilitated by forming solder or gold bumps on the IC's input and/or output terminals. Accordingly, the flipped IC chip is referred to as a flip-chip. During manufacturing, the flip-chip is aligned to the chip carrier and all connections are made simultaneously by reflowing the solder. The flip-chip technology, therefore, allows for direct interconnecting pads of an integrated circuit (IC) chip to corresponding contacts on the main circuit board.

Another and more conventional method by which terminals of an IC chip are connected to contacts of the circuit board or the chip carrier is wirebonding. In a wirebonded IC chip, an upwardly-facing chip is placed on a circuit substrate such that its input and/or output terminals are exposed. An array of wires connect these terminals to corresponding contacts on the circuit substrate. The wires connect the terminal to the contacts using well-known wirebonding or tape-automated bonding techniques.

As a result of increasing complexity of large scale integrated circuit chips, a larger area or real estate is required for packaging the IC chip. Generally, one or more IC chips are electrically coupled to each other in order to make the electronic device functional. For example, a microprocessor and a number of memory devices may be electrically coupled to each other in order to provide operational control for the electronic device. Conventionally, the microprocessor chip and the memory chips are positioned next to each other on one surface or on opposing surfaces of a main circuit board which includes a substantially large number of components. The terminals of the IC chips are coupled to each other by means of circuitry disposed on or within the circuit board. This approach, however, consumes substantial real estate because the area required for positioning each IC chip must be accommodated for on the circuit board.

In order to enhance real estate utilization, stacked integrated circuit chip arrangements are conventionally used. In such arrangements, two or more IC chips are stacked on top of each other. In the conventional stacked arrangement, however, all of the IC chips are either faced downwardly, upwardly, or side by side, wherein all face in one direction. This arrangement, however, makes the interconnection among their terminals and external circuitry substantially difficult and complex. Therefore, it is desired to position two or more chips on a circuit board without consuming a lot of real estate while providing simple interconnections between the terminals of the IC chips and the external circuitry.

SUMMARY OF THE INVENTION

Briefly, according to the invention, an integrated circuit package comprises a stacked integrated circuit chip arrangement placed on a chip carrier which includes an array of electrical terminals for connection to external circuitry. The stacked IC chip arrangement includes a first IC chip having a first array of electrical terminals positioned on a first major surface, a second IC chip having a second array of electrical terminals positioned on a second major surface, an interposed substrate having a top surface for placing the first IC chip thereon, and a bottom surface for placing the second IC chip such that the first and second IC chips are situated in a face-to-face manner. That is, the first major surface and the second major surface are positioned in front of each other. The interposed substrate includes circuitry for providing electrical interconnection between the the first array of terminals and the second array of terminals and interposed terminals for allowing electrical connections to the external circuitry. An interconnection means couples the interposed terminals to the external circuitry disposed on a circuit board.

DETAILED DESCRIPTION OF THE PREFERRED EMBODIMENT

Figure 1:
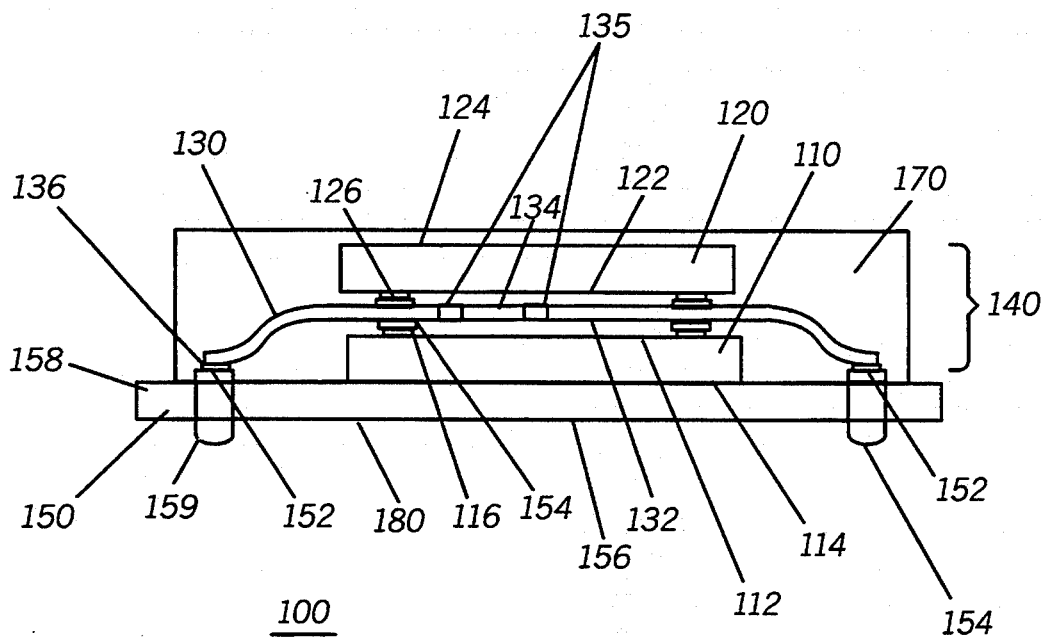
FIG. 1 is a cross-sectional view of the integrated circuit assembly according to one embodiment of the present invention.

Referring to FIG. 1, the cross-sectional view of one embodiment of the integrated circuit assembly 100, according to the present invention, is shown. The integrated circuit assembly 100 includes a stacked, integrated circuit chip arrangement 140 which is placed on a circuit substrate 150. The stacked integrated circuit chip arrangement 140 includes a first integrated circuit (IC) chip 110 and a second IC chip 120 which, as described herein later, are stacked in a face-to-face manner. The first IC chip 110 and the second IC chip 120 are fabricated, utilizing conventionally-known IC manufacturing processes, each including suitable terminals for connection to external circuitry. The first IC chip 110 may be a well-known IC, such as a microprocessor IC or a first memory IC, and the second IC chip 120 may be another well-known IC, such as a co-processor or a second memory IC. The integrated circuit assembly 100 may, therefore, be an electrical assembly for a particular application, such as for providing operational control for an electronic device. In one embodiment of the present invention (shown in FIG. 1), the first IC chip 110 and the second IC chip are bumped ICs which can be directly coupled to circuitry on a substrate without extra wirebonding or similar operations. However, as will be described in relation to other embodiments of the present invention, at least one of these IC chip may also comprise conventional IC dies which may be coupled to external circuitry by a wirebonding process.

The first IC chip 110 has a first surface 112 and a second surface 114 on its opposing sides. Similarly, the second IC chip 120 has a third surface 122 and a fourth surface 124 on its opposing sides. The first surface 112 and the third surface 122 are substantially bumped surfaces which, respectively, constitute the front surfaces of the first IC chip 110 and the second IC chip 120. The second surface 112 constitutes the back surface of the first IC chip 110 and the fourth surface 122 constitutes the back surface of the second IC chip 120.

The first surface 112 of the first IC chip 110 has formed thereon a first array of terminals 116 constituting the input and output terminals therefor. In the preferred embodiment, the first array of terminals 116 are formed as half cylindrical solder balls (or gold balls) creating an array of solder/gold bumped terminals. Similarly, the third surface 122 of the second IC chip 120 includes a second array of terminals 126 which, like the first array of terminals 116, contain metal bumped bonding pads.

According to the invention, the first IC chip 110 and the second IC chip 120 are arranged in a face-to-face manner such that the first surface 112, i.e., front surface of the first IC chip 110, and the third surface 122, i.e., the front surface of the second IC chip 120, are positioned in front of each other. In other words, as shown in FIG. 1, the front surface of the first IC chip 110 and the front surface of the second IC chip 120 face each other in such a manner that the third surface 122 is positioned above the first surface 112.

In this embodiment, the stacked integrated circuit chip arrangement 140 is produced by attaching the first IC chip 110 and the second IC chip 120 to an interposed substrate 130 which, as will be described later, includes interconnection means for electrically coupling the IC chips 110 and 120. The interposed substrate 130 has a top surface 132 and a back surface 134 upon which the first IC chip 110 and the second IC chip 120, respectively, are positioned. That is, the first IC chip is placed on the top surface 132 and the second IC chip 120 is placed on the bottom surface 134 of the interposed substrate 130. The interposed substrate 130 in this embodiment of the invention comprises a flexible circuit substrate having electrical circuitry disposed on its opposing surfaces. The interposed substrate 130 as contemplated herein is well known and is generally used in Tape Automated Bonding (TAB) techniques for providing interconnections between a die and a circuit substrate.

Figure 2:
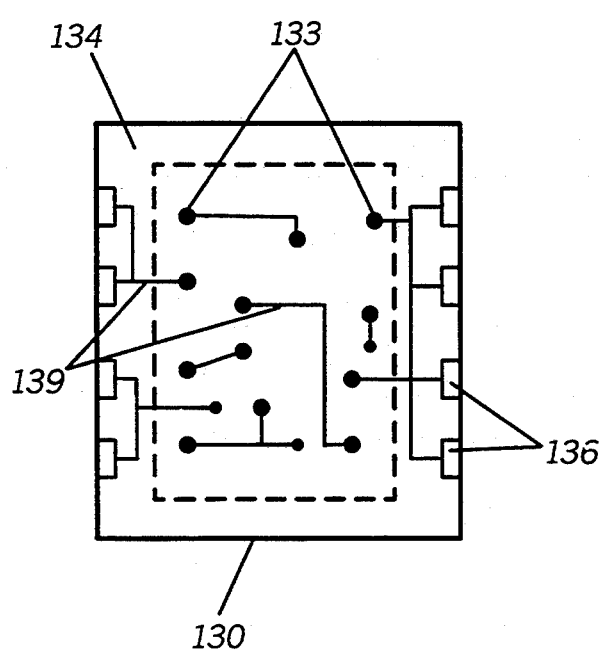
FIG. 2 is the top plan view of one configuration of a interposed substrate used in the integrated circuit assembly of FIG. 1.
Figure 3:
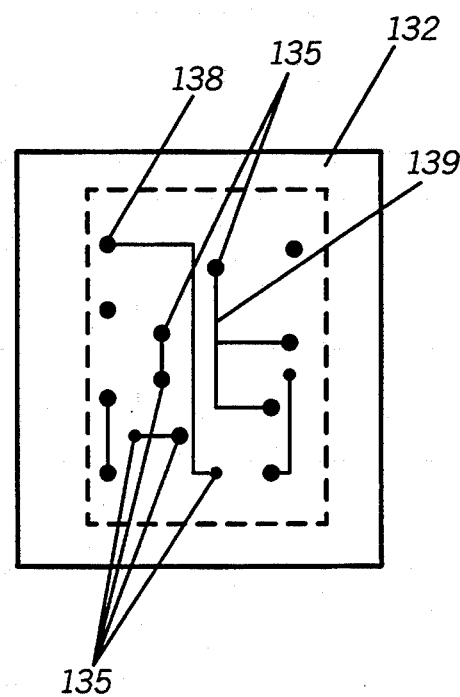
FIG. 3 is the bottom plan view of the interposed substrate of FIG. 2.

Referring to FIG. 2 and FIG. 3, respectively shown, are top plan views of the bottom surface 134 and the top surface 132 of the interposed substrate 130. Each of the surfaces 132 and 134 has metallized circuitry disposed thereon to provide contacts for the terminals of the first IC chip 110 and the second IC chip 120. The bottom surface 134 includes a first array of contacts 138 which correspond to the first array of terminals 116 and the top surface 132 includes a second array of contacts 133 which correspond to the second array of terminals 126. Each surface of the interposed substrate 130 includes electrical circuitry 139, as well as conductive through holes 135, for interconnecting the terminals of the first and the second IC chips 110 and 120. The circuitry disposed on the interposed substrate comprises inner leads disposed within the innermost regions of the interposed substrate (shown in dotted line) for providing chip interconnections, and outer leads which extend the connections from the IC chips and terminate in an array of interposed substrate terminals 136 disposed on the bottom surface 132. The interposed substrate terminals 136 provide for outer connecting the circuitry of the stacked IC arrangement 140 to external circuitry.

In some applications, it is desired to electrically couple two ICs having terminals of the ICs which are mirror images of each other. One such application comprises coupling two memory ICs to each other in order to increase memory capacity. In such an arrangement, the terminals of the memory ICs are generally mirror images of each other, in that there exists one-to-one correspondence between the terminal of one memory IC and another memory IC. In this arrangement, when the two memory ICs are positioned in a face-to face manner, terminals of one memory IC may be directly coupled to corresponding terminals of the other memory IC so as to double the memory capacity.

Figure 4:
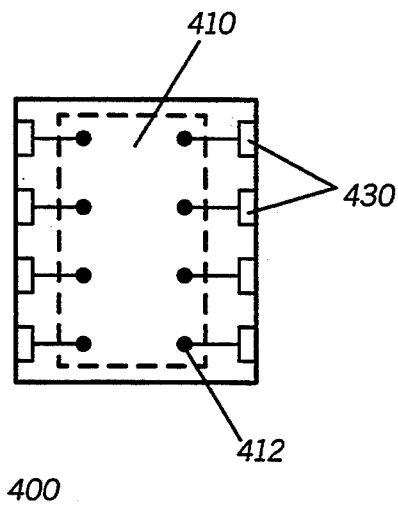
FIG. 4 is the top plan view of another configuration of an interposed substrate used in the integrated circuit assembly of FIG. 1.
Figure 5:
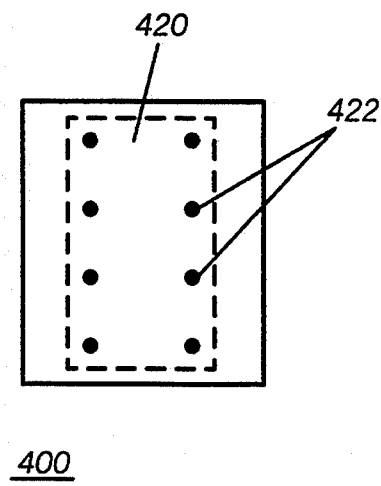
FIG. 5 is the bottom plan view of the interposed substrate of FIG. 4.

Referring to FIGS. 4 and 5, bottom surface 410 and top surface 420 of a interposed substrate 400 are configured to provide a one-to-one connection between the corresponding terminals of the first IC chip 110 and the second IC chip 120. The interposed substrate 400 like interposed substrate 130 comprises a flexible circuit substrate which could be positioned utilizing TAB technology. A first array of contacts 422 disposed on the bottom surface 420 is arranged to correspond to the first array of terminals 116, and a second array of contacts 412 disposed on the top surface 410 is arranged to correspond to the second array of contacts 126. In the preferred embodiment, the first array of contacts 422 are directly and correspondingly coupled to the second array of contacts 412 via conductive through holes (not shown) in a well-known manner. In this way, the interposed substrate 400 provides the means for directly and correspondingly coupling the first array of terminals 116 to the second array of terminals 126. Similar to the interposed substrate 130 of FIGS. 2 and 3 interleads are shown within a dotted rectangle. The outer leads terminate in an array of interposed substrate terminals 430 disposed on the bottom surface 410 which provide for outer connecting the circuitry of the stacked IC arrangement 140 to external circuitry.

Referring back to FIG. 1, the stacked integrated circuit chip arrangement 140 is shown to be placed on a top surface 158 of the circuit substrate 150. The circuit substrate 150 may be made of any suitable material such as organic, or ceramic materials. The circuit substrate 150 includes an array of circuit substrate contacts 152 corresponding to the interposed substrate terminals 136 of FIG. 2 (or 430 of FIG. 4). Metallization disposed on the circuit substrate 150 for producing the contacts 152 may, for example, be one of or a combination of copper, tin, lead, aluminum, or gold. The metallization disposed on the circuit substrate 150 utilizes well-known circuit board manufacturing techniques.

In order to provide the integrated circuit assembly 100, the stacked IC chip arrangement 140 is placed on the circuit substrate 150 such that the bottom surface 114 of the first IC chip 110 is positioned on the top surface 158. In this way, the first IC chip 110 is placed on the circuit substrate 150 and is aligned with the bottom surface 132 of the interposed substrate 130 such that the first array of terminals 116 could be directly coupled to the first array of interposed contacts 138 of FIG. 3 (or 422 of FIG. 5). The interposed substrate is placed over the first IC chip 110 using the TAB connection method in which the first array of terminals 116 and the first array of substrate contacts (138 or 422) may be coupled to each other by well-known methods, such as by utilizing reflow, thermosonic, or pressure contact methods. The interposed substrate terminals 136 (or 430) are then directly coupled to the array of circuit substrate contacts 152 as is well known with TAB techniques. The second IC chip 120 is aligned on the top surface of the interposed substrate 130 such that the second array of terminals 126 could be directly coupled to the interposed substrate contacts 133 (or 412 of FIG. 4) as described above.

According to this embodiment of the invention (shown in FIG. 1), the circuit substrate 150 comprises a chip carrier with no other components disposed thereon. In this arrangement, the integrated circuit assembly 100 is placeable on an external main circuit board (not shown) as a single component. It may be appreciated that after the stacked IC chip arrangement 140 (shown in FIG. 1) is placed on the chip carrier or circuit substrate 150, the total package may be encapsulated by an encapsulation layer 170 made of such protective materials as silicone, epoxy, ceramic, or other suitable material. The encapsulation layer 170 may be disposed on the circuit assembly 100 primarily for mechanical and/or environmental protection; however, the layer may also facilitate placement of the integrated circuit assembly 100 on the external circuit board. It should be noted that such encapsulation layer is not required to effectuate the purpose of the present invention.

In the chip carrier arrangement, depending upon "x" and "y" spacing requirements, either peripheral or pad array terminals may be formed to couple the integrated circuit assembly 100 to the external circuit board. If pad array terminals are desired, miniature solder bumps 159 would be formed on bottom surface 156 of the circuit substrate 150 for coupling the integrated circuit assembly 100 to circuitry of the external circuit board. Accordingly, in the preferred embodiment of the invention, the chip carrier terminals 159 comprise solder bumps formed on bottom surface 156 of the circuit substrate 150 for providing a flip-chip like arrangement for the integrated circuit assembly 100.

Figure 6:
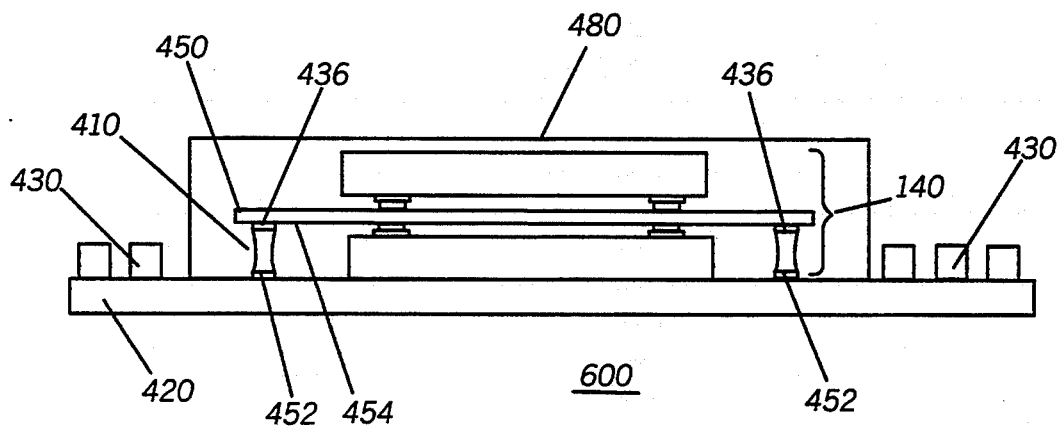
FIG. 6 is the cross-sectional view of an integrated circuit assembly according to another embodiment of the present invention.

Referring to FIG. 6, the cross-sectional view of another embodiment of an integrated circuit assembly 600, according to the present invention, is shown. In this embodiment, the integrated circuit assembly 600 is utilized in a a mother board arrangement, wherein a main circuit board 420 (corresponding to circuit substrate 150 of FIGS. 1 and 2) includes external components 430 and circuitry and circuit board contacts 452. Generally, in this arrangement, the components 430 are electrically interconnected by circuitry disposed on the main circuit board 420 which is better known as a "mother board." Although, the placement techniques and interconnection means described in conjunction with the chip carrier version of the integrated circuit assembly 100 are equally applicable to the mother board arrangement of the integrated circuit assembly 600, this embodiment of the invention contemplates using a novel method for interconnecting the interposed substrate terminals to the circuit substrate contacts 452. This novel interconnection method is described in more detail in conjunction with a integrated circuit assembly disclosed in FIG. 7. In this arrangement, an interposed substrate 450, similar to the interposed substrate 130, has its interposed substrate terminals 436 on a bottom surface 454. The interposed substrate terminals 436 are aligned with the circuit substrate contacts 452 such that a reflowed solder ball 410 may be disposed between them for providing the electrical outer connection. Initially, the solder balls 410 may either be disposed on the circuit substrate contacts 452 or, alternatively, they may be disposed on the interposed substrate terminal 436, wherein a subsequent reflow process electrically bonds the first circuit contacts 452 to interposed terminal contacts 436.

Figure 7:
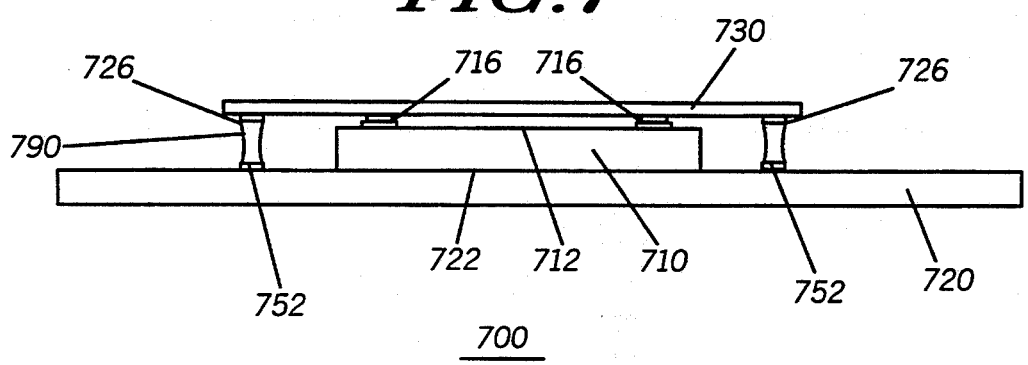
FIG. 7 is the cross-sectional view of an integrated circuit assembly according to one more embodiment of the present invention.

Referring to FIG. 7, an integrated circuit assembly 700 is disclosed which illustrates the novel interconnection aspect used in the integrated circuit assembly 600 (shown in FIG. 6). As shown, the integrated circuit assembly 700 does not have to necessarily include a stacked integrated circuit arrangement as described above. Instead, the main focus of the embodiment of the integrated circuit assembly 700 is to disclose the novel interconnection between an an integrated circuit chip 710 and a circuit substrate 720 through a interposer substrate 730. The IC chip 710 has an array of bumped IC terminals 716 on its front surface 712. The IC chip 710 has a substantially flat opposing back surface 722. The back surface of the integrated circuit chip 710 is placed on the circuit substrate 720 and bonded thereto via a bonding layer or other well-known methods. The upwardly facing array of IC terminals 716 include solder bumps (or gold bumps) for electrically coupling to corresponding contacts of the interposed substrate 730. As described above, the interposer substrate has conductive circuitry including interposed contacts and terminals disposed on its major surfaces for redistributing the connections of the array of IC terminals 716 to interposed terminals 726. The interposed substrate 730 may comprise well-known thin PCB. Alternatively, it may comprise a flexible circuit substrate having corresponding interposed contacts and terminals. The interposed substrate 730 is positioned above the front surface of the IC chip 710 such that the IC terminals 716 are coupled to corresponding contacts on the interposed substrate. The circuit substrate 720 includes substrate contacts 752 which are disposed outside of area taken up by the IC chip 710. The substrate contacts 752 and the interposed terminals 726 substantially oppose each other, i.e. are positioned substantially in front of each other. Reflowed solder balls 790 having a height substantially equal to the combined height of the IC chip 710, a solder bump of the array terminal 716, and the bonding layer is disposed between the opposing interposer terminal 726 and the substrate contact 752 to provide the novel interconnection of this embodiment of the present invention.

Thus, during assembly, first the IC chip 710 is coupled to the interposed substrate by well-known high temperature reflow or similar processes. Then, the back surface of the IC chip 720 is placed on the circuit substrate 720 which includes a bonding layer of suitable composition disposed on its surface. The circuit substrate 720 also includes solder balls 790 deposited on the circuit substrate terminals 752. The reflowed solder balls 790 having a height being at least equal to the height of the IC chip 710. The interposed substrate terminals 726 are aligned with the solder balls and an electrical coupling is produced through a subsequent reflow operation.

It may be appreciated that the reflowed solder ball interconnection method just described is also applicable to the integrated circuit assembly 100, the only difference being that the required placement and interconnection operations would take place on the chip carrier rather than on a main circuit board. As a final operation, an encapsulation layer 480 similar to the encapsulation layer 170 of integrated circuit assembly 100 is disposed on the circuit substrate 420 for protection purposes.

The integrated circuit assemblies described according to the present invention, utilize two IC chips which are attached in a face-to-face manner and are positioned on a chip carrier or a main circuit board. The principals of the present invention provide a simplified interconnection mechanism between the IC chips and the circuit substrate. The integrated circuit assemblies of the invention utilize both direct chip-attach interconnection and wirebonding methods. These interconnection techniques are well known and applying them to the face-to-face IC chip arrangements of the invention substantially enhance the use of real estate on a circuit board. Furthermore, the process for producing a stacked, integrated circuit assembly is greatly simplified.

What is claimed is:

1. An integrated circuit chip carrier assembly, comprising:

a stacked integrated circuit chip arrangement including:
 a first integrated circuit chip having a first array of terminals positioned on a first major surface;
 a second integrated circuit chip having a second array of terminals positioned on a second major surface;
 a flexible interposed substrate having a major top surface and a major bottom surface is positioned between the first integrated circuit chip and the second integrated circuit chip, wherein the first integrated circuit chip is placed on the major bottom surface and the second integrated circuit chip is placed on the major top surface such that the first major surface and the second major surface are positioned in front of each other, the flexible interposed substrate having:
  an array of interposed substrate contacts corresponding to the first array of terminals;
  a second array of interposed substrate contacts corresponding to the second array of terminals;
  at least one through hole containing an electrically conductive member that interconnects the first array of interposed substrate contacts to the second array of interposed substrate contacts; and
  an array of interposed substrate terminals for allowing electrical coupling to external circuitry;
 a circuit substrate for positioning the stacked integrated circuit arrangement thereon, including an array of circuit substrate contacts corresponding to the array of interposed substrate terminals on a first major side, and an array of solder bumps on an opposing second major side;
 interconnection means for correspondingly interconnecting the array of interposed substrate terminals to the array of circuit substrate contacts; and
 the stacked integrated circuit arrangement encapsulated in an epoxy resin to form an encapsulated chip carrier.

2. The integrated circuit assembly of claim 1, wherein the first integrated circuit chip comprises a flip-chip package having solder bumped terminals constituting the first array of terminals.

3. The integrated circuit assembly of claim 1, wherein the second integrated circuit chip comprises an flip-chip package having solder bump terminals constituting the second array of terminals.

* * * * *